(12) United States Patent
Allen et al.

(10) Patent No.: US 7,476,492 B2
(45) Date of Patent: Jan. 13, 2009

(54) LOW ACTIVATION ENERGY PHOTORESIST COMPOSITION AND PROCESS FOR ITS USE

(75) Inventors: Robert David Allen, San Jose, CA (US); Richard Anthony DiPietro, Campbell, CA (US); Ratnam Sooriyakumaran, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 11/441,965

(22) Filed: May 26, 2006

(65) Prior Publication Data

US 2007/0275324 A1 Nov. 29, 2007

(51) Int. Cl.
*G03F 7/30* (2006.01)
*G03F 7/004* (2006.01)

(52) U.S. Cl. .............. 430/326; 430/270.1; 430/330; 430/907; 430/910

(58) Field of Classification Search .............. 430/270.1, 430/326, 330, 907, 910
See application file for complete search history.

(56) References Cited

U.S. PATENT DOCUMENTS

| | | | |
|---|---|---|---|
| 6,136,501 A | 10/2000 | Trefonas | |
| 6,165,678 A | 12/2000 | Allen | |
| 6,177,228 B1 | 1/2001 | Allen | |
| 6,479,211 B1 | 11/2002 | Sato | |
| 6,517,993 B2 | 2/2003 | Nakamura | |
| 6,806,026 B2 | 10/2004 | Allen | |
| 6,835,527 B2 * | 12/2004 | Takata et al. ............. | 430/270.1 |
| 6,852,468 B2 | 2/2005 | Sato | |
| 6,962,766 B2 * | 11/2005 | Uenishi et al. ........... | 430/270.1 |
| 7,037,636 B2 * | 5/2006 | Fujita ...................... | 430/270.1 |
| 7,063,931 B2 * | 6/2006 | Li et al. ................... | 430/270.1 |
| 2004/0265733 A1 * | 12/2004 | Houlihan et al. ......... | 430/270.1 |
| 2005/0031984 A1 | 2/2005 | Takata | |
| 2005/0089796 A1 | 4/2005 | Funatsu | |
| 2005/0123852 A1 * | 6/2005 | Allen et al. .............. | 430/270.1 |
| 2005/0124774 A1 | 6/2005 | Allen | |
| 2005/0158656 A1 | 7/2005 | Takemoto | |
| 2005/0208418 A1 | 9/2005 | Bea | |

FOREIGN PATENT DOCUMENTS

EP 1 148044 A1 10/2001

OTHER PUBLICATIONS

Hinsberg et. al. Liquid Immersion Lithography Evaluation of Resist Issues; Proccedings of SPIE vol. 5376 (2004 USA).

Hinsberg et. al. Effect of Resist Components on Image Spreading During Post Exposure Bake of Chemically Amplified Resists; Proceedings of SPIE vol. 3999 (2000 USA).

Brown et. al. The Effect of Ring Size on the Rate of Acetolysis of the Cycloalkyl p-toluene and p-bromosulfonates; JACS 78, 2735 (1956 USA).

* cited by examiner

*Primary Examiner*—John S Chu
(74) *Attorney, Agent, or Firm*—Robert B. Martin; Daniel E. Johnson

(57) ABSTRACT

The present invention relates to a radiation sensitive photoresist composition. The composition comprises a polymer comprising at least two monomers. The first monomer has an acid cleavable tertiary ester group. The second monomer is an acidic monomer. The acid cleavable ester group of the polymer has a surprisingly low activation energy which results in improved resist images in lithographic processes.

1 Claim, 9 Drawing Sheets

| Polymer | Decomposition Temp. by TGA (degree C) |
|---|---|
| NBHFAMA/ECPMA | 207 |
| NBHFAMA/ECHXMA | 211 |
| NBHFAMA/ECHPMA | 189 |
| NBHFAMA/ECOMA | 164 |
| NBHFAMA/ECDMA | 180 |
| NBHFAMA/ECDDMA | 208 |

FIG. 1

1:1 line/space images 50 nm 1:1 line/space images 40 nm 1:1 line/space images

LOW ACTIVATION ENERGY PHOTORESIST COMPOSITION AND PROCESS FOR ITS USE

BACKGROUND OF THE INVENTION

The patterning of radiation sensitive polymeric films with high energy radiation flux such as photons, electrons, or ion beams is the principle means of defining high resolution circuitry found in semiconductor devices. The radiation sensitive films, often referred to as photoresists regardless of the radiation source, generally consist of multicomponent formulations that are coated onto a desired substrate such as a silicon wafer. The photoresist film is then exposed to radiation. The radiation is most commonly ultraviolet light at wavelengths of 436, 365, 257, 248, 193 or 157 nanometers (nm), or a beam of electrons or ions, or 'soft' x-ray radiation, also referred to as extreme ultraviolet (EUV) or x-rays. The radiation is exposed patternwise to induce a chemical transformation that renders the solubility of the exposed regions of the film different from that of the unexposed areas. The film is then heated to enhance this chemical transformation. After heating, the film is treated with an appropriate developer, usually a dilute, basic aqueous solution, such as aqueous tetraethylammonium hydroxide (TMAH) to develop the photoresist image on the wafer.

Typical photoresists contain a polymeric component and are generally comprised of a polymeric matrix, a radiation sensitive component, a casting solvent, and other performance enhancing additives. The highest performing photoresists in terms of sensitivity to radiation and resolution capability are "chemically-amplified" photoresists, allowing high resolution, high contrast and high sensitivity that are not generally provided by other photoresists. Chemically amplified photoresists are based on a catalytic mechanism that allows a relatively large number of chemical events such as, for example, deprotection reactions in the case of positive tone photoresists or crosslinking reactions in the case of negative tone photoresists, to be brought about by the application of a relatively low dose of radiation that induces formation of the catalyst, often a strong acid.

Most of the current positive resist compositions comprise aqueous base soluble functional groups that are sufficiently protected with acid labile groups so that the resist initially will not dissolve in a developer. During exposure to radiation, the photoacid generator (PAG) present in the resist composition produces strong acid, which then catalyzes the removal of the acid labile groups on heating (PEB). This process produces aqueous base soluble material in the exposed area which then is developed with a basic aqueous developer to produce the images. Many of the current photoresists contain aqueous base soluble carboxylic acid functional groups that are protected with acid labile groups to produce aqueous base insoluble ester. The mechanism of the acid-catalyzed deprotection of the esters in the resist is as follows. Water is not needed for this reaction to occur.

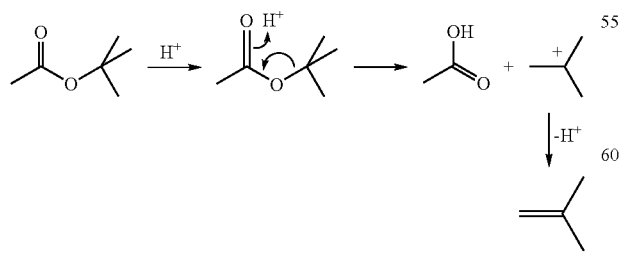

The ease of this deprotection reaction depends on the stability of the carbocation. That is, if the carbocation is more stable, the activation energy for the reaction will be lower which will lead to deprotection at a lower temperature. It was long recognized that the ring-size of cycloalkyl tosylates has a strong effect on the stability of carbocations (H. C. Brown et. al., JACS, 78, 2735 (1956)). The rates of acetolysis of cycloalkyl tosylates were reported in this paper.

Although chemically-amplified resists have been developed for 248, 193 and 157 nm lithography, certain barriers to achieving higher resolution and smaller feature sizes remain due to physical, processing and material limitations. One such phenomenon that arises for imaging in the sub-50 nm regime, resulting in diminished image integrity in the pattern, is referred to as "image blur" (see, e.g., Hinsberg et al., *Proc. SPIE*, (2000), 3999, 148). Image blur is generally thought to result from two contributing thermally driven factors: gradient-driven acid diffusion and reaction propagation, the result being a distortion in the developable image compared to the projected aerial image transferred onto the film. The key metric controlling the image blur is the ratio R=(average rate of acid catalyzed deprotection)/(average rate of acid diffusion). The greater the value of the ratio R, the lower the image blur (Hinsberg et al., *Proc. SPIE*, (2004), 5376, 21). If the activation energy for the deprotection reaction is less than that of the diffusion process, then a reduction in post exposure bake (PEB) temperature will increase the value of R. Therefore, in order to minimize the image blur and achieve higher resolution, there is a need to develop new polymers with lower activation energy (low-Ea) protecting groups. Such new polymers will have the deprotection chemistry occurring at significantly lower temperatures and therefore the processing temperature can be lower and hence limit the blur from photoacid diffusion.

SUMMARY OF INVENTION

The present invention relates to a radiation sensitive photoresist composition. The composition comprises a polymer. The polymer comprises at least two monomers. The first monomer has an acid cleavable tertiary ester group. The second monomer is an acidic monomer having a $pK_a$ value of about 6 to 12. A suitable polymer comprises (i) a first olefinic monomer having an acid cleavable tertiary ester group and having the formula:

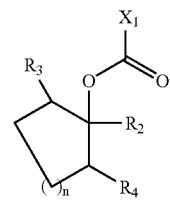

where $X_1$ is selected from $C_{2-3}$ alkylenyl or fluorinated alkylenyl or $C_{4-20}$ cycloalkylenyl; $R_2$ is selected from $C_{1-6}$ alkyl or $C_{4-20}$ cycloalkyl each optionally containing one or more heteroatoms; and where $R_3$ and $R_4$ are independently each selected from hydrido, $C_{1-6}$ alkyl, $C_{4-20}$ cycloalkyl or $C_{1-6}$ alkoxy and n is 3-8; and (ii) a second olefinic monomer selected from (a) a hydroxy containing olefinic monomer having the formula:

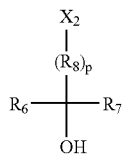

where $X_2$ is selected from $C_{3-4}$ alkylenylcarbonyloxy, $C_{5-20}$ cycloalkylenylcarbonyloxy or $C_{4-20}$ cycloalkylenyl each optionally substituted with one or more fluoro substituents; $R_8$ is $C_{1-6}$ alkyl or $C_{4-20}$ cycloalkyl each optionally substituted with one or more substituents selected from hydroxy and fluoro substituents, p is 0 or 1; $R_6$ is selected from hydrido, trifluoromethyl, difluoromethyl, fluoromethyl, or $C_{1-6}$ alkyl or $C_{4-8}$ cycloalkyl each optionally substituted with one or more fluoro substituents, and $R_7$ is selected from trifluoromethyl, difluoromethyl, fluoromethyl or $C_{1-6}$ alkyl or $C_{4-8}$ cycloalkyl substituted with one or more fluoro subtiutents and further $R_6$ and $R_7$ can be linked to form a cyclic group, and (b) a sulfonylamido containing olefinic monomer having the formula:

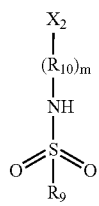

where $X_2$ is selected from $C_{3-4}$ alkylenylcarbonyloxy or $C_{5-20}$ cycloalkylenylcarbonyloxy or $C_{4-20}$ cycloalkylenyl each optionally substituted with one or more fluoro substituents; $R_{10}$ is $C_{1-6}$ alkyl or $C_{4-20}$ cycloalkyl each optionally substituted with one or more fluoro substituents; m is 0 or 1; and $R_9$ is $C_{1-4}$ alkyl or $C_{4-20}$ cycloalkyl each optionally substituted with one or more fluoro substituents. In another embodiment, the second monomer can be a phenolic monomer such as styrene or vinylnaphthalene each substituted with one to three hydroxy substituents.

The polymer can optionally comprise other monomers which are desired to enhance performance. In another embodiment, the composition comprises a photoacid generator. The composition can also comprise other desired additives such as solvents, dissolution inhibitor, dyes and the like.

The present invention also relates to the process for generating a photoresist image on a substrate using the composition of the present invention. The composition of the present invention has low activation energy for the acid cleavable reaction and therefore the composition can be used in a process with lower PEB temperatures resulting in improved resist images.

BRIEF DESCRIPTION OF THE DRAWINGS

FIG. 1 is a table showing the decomposition temperatures of polymers of the present invention;

DESCRIPTION OF THE PREFERRED EMBODIMENTS

Figure 2:
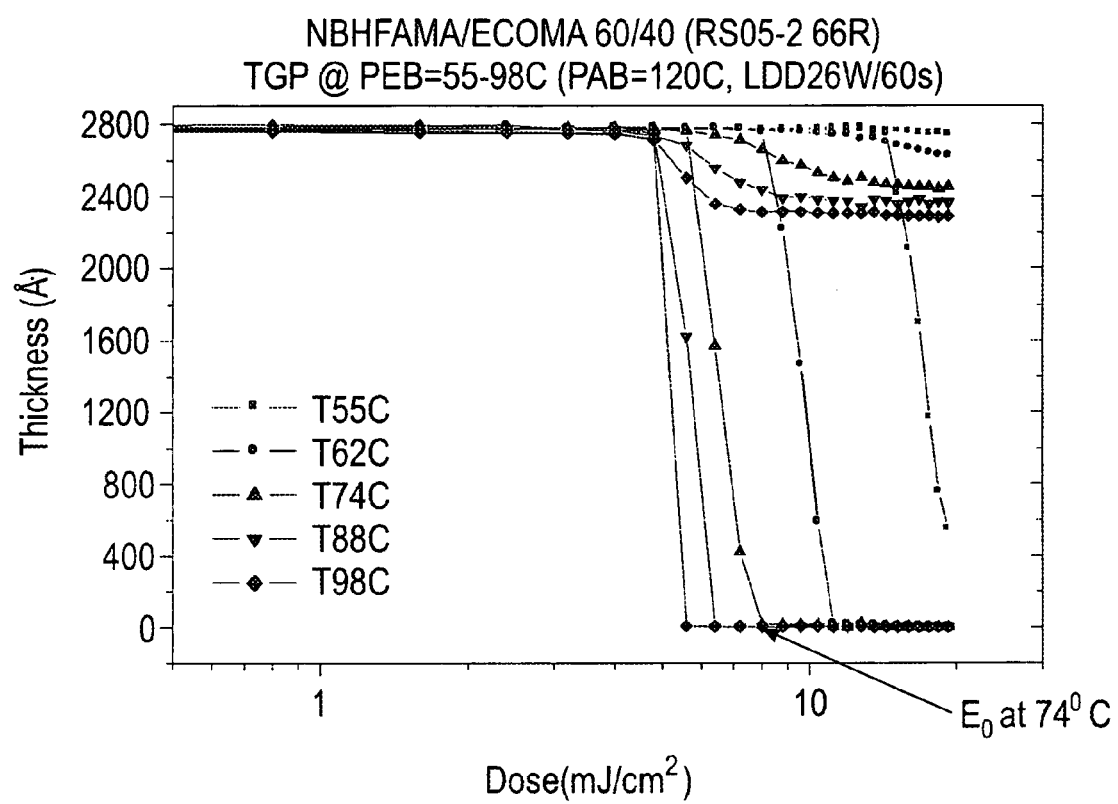
FIG. 2 is graph of a contrast curve for a polymer of the present invention.

The present invention relates to a photoresist composition. The composition comprises a polymer. The polymer comprises a first monomer having an acid cleavable tertiary ester substituent and a second monomer select from a monomer having a hydroxy substituent and a monomer having a sulfonylamido substituent. In one embodiment, the polymer comprises monomers as follows (i) a first olefinic monomer having the formula:

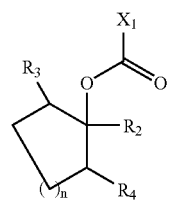

where $X_1$ is selected from $C_{2-3}$ alkylenyl or fluorinated alkylenyl or $C_{4-10}$ cycloalkylenyl; $R_2$ is selected from $C_{1-6}$ alkyl or $C_{4-8}$ cycloalkyl each optionally containing a heteroatom; and where $R_3$ and $R_4$ are independently each selected from hydrido, $C_{1-6}$ alkyl, $C_{4-8}$ cycloalky or $C_{1-6}$ alkoxy and n is 3-8; and (ii) a second olefinic monomer having the formula:

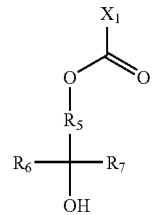

where $X_1$ is selected from $C_{2-3}$ alkylenyl or fluorinated alkylenyl or $C_{4-10}$ cycloalkylenyl; $R_5$ is $C_{1-20}$ alkyl or $C_{4-20}$ cycloalkyl each optionally substituted with one or more substituents selected from hydroxy and fluoro substituents; $R_6$ is selected from hydrido, trifluoromethyl, difluoromethyl, fluoromethyl, or $C_{1-6}$ alkyl or $C_{4-8}$ cycloalkyl each optionally substituted with one or more fluoro substituents, and $R_7$ is selected from trifluoromethyl, difluoromethyl ,fluoromethyl or $C_{1-6}$ alkyl or $C_{4-8}$ cycloalkyl substituted with one or more fluoro substituents and further $R_6$ and $R_7$ can be linked to form a cyclic group.

In one embodiment of the polymer of the present invention, the monomers in the polymer are acrylate or methacrylate monomers. In another embodiment of the present invention, $R_2$ is $C_{1-4}$ alkyl; and $R_3$ and $R_4$ are independently hydrido or $C_{1-4}$ alkyl and n is 3-6. In another embodiment, n is 4; $R_2$ is methyl or ethyl; and $R_3$ and $R_4$ are independently hydrido, methyl or ethyl; and $R_6$ and $R_7$ are independently selected from difluoromethyl and trifluoromethyl.

The term "alkyl" as used herein refers to a branched or unbranched saturated hydrocarbon substituent. The term "cycloalkyl" as used herein refers to a hydrocarbon substituent whose structure is characterized by a closed ring and shall include compounds which also have one or more mono or divalent alkyl groups attached to the closed ring. The term "alkoxy" as used herein refers to a substituent —O—R where R is an alkyl group. The term "alkylenyl" as used herein refers to a branched or unbranched unsaturated hydrocarbon substituent having at least one double bond (such as R—HC=CH—R—; H$_2$C=CH—R—; and R—HC=CH— where R is alkyl). The term "heteroatom" as used herein shall mean a divalent atom selected from nitrogen, oxygen or sulfur positioned within an alkyl group. (such as —CH$_2$—NH—CH$_2$—)

The acid cleavable monomer of the polymer of the present invention has an acid cleavable tertiary ester substituent which has surprisingly low activation energy. This low activation energy is believed to be due to interactions between the first and second monomers of the polymer of the present invention. Due to the low activation energy of the cleavable substituent, the polymer does not require a high PEB temperature to cause the acid cleavage of the ester substituent after the photoresist composition has been exposed to radiation. This low activation energy allows the use of a low PEB temperature thereby minimizing undesired thermally catalyzed diffusion of the photogenerated acid to areas of the photoresist film which were not exposed to radiation resulting in sharper line widths and improved resist performance.

Suitable acid cleavable monomers for the polymer of the present invention include the following:

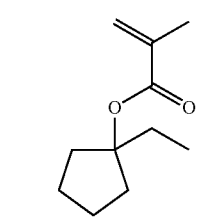
1-Ethylcyclopentyl methacrylate
(ECPMA)

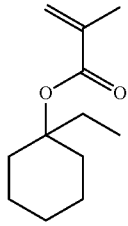
1-Ethylcyclohexyl methacrylate
(ECHXMA)

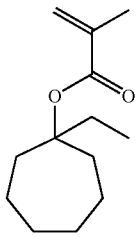
1-Ethylcycloheptyl methacrylate
(ECHPMA)

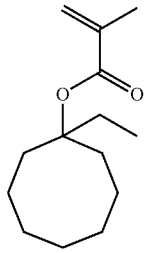
1-Ethylcyclooctyl methacrylate
(ECOMA)

-continued

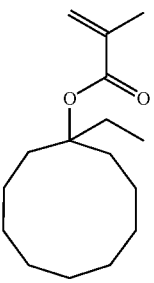
1-Ethylcyclodecyl methacrylate
(ECDMA)

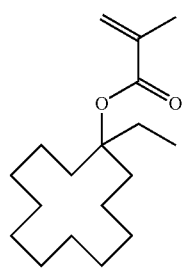
1-Ethylcyclododecyl methacrylate
(ECDDMA)

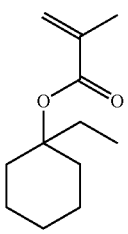
1-Ethylcyclohexyl methacrylate
(ECHXMA)

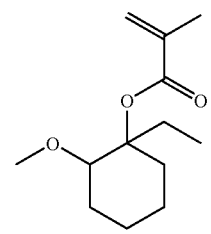
1-Ethyl-2-methoxycyclohexyl methacrylate
(EMOCHMA)

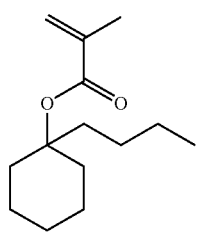
1-Butylcyclohexyl methacrylate
(BCHXMA)

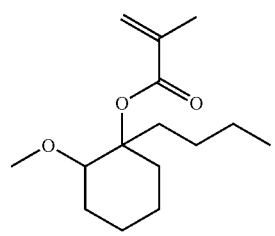
1-Butyl-2-methoxycyclohexyl methacrylate
(BMOCHXMA)

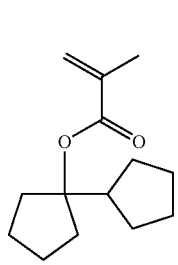
1-Cyclopentylcyclopentyl methacrylate
(CPCPMA)

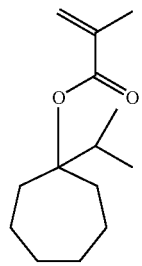
1-isopropylcycloheptyl methacrylate
(IPCHPMA)

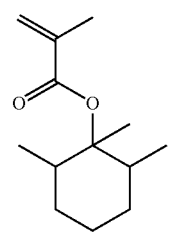
2,5-dimethyl-1-methylcyclohexyl methacrylate

Suitable hydroxy containing monomers are as follows:

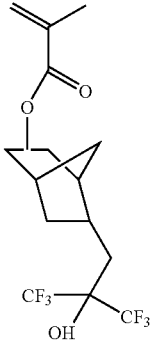
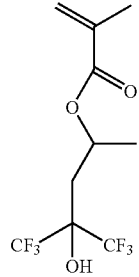

(NBHFAMA)

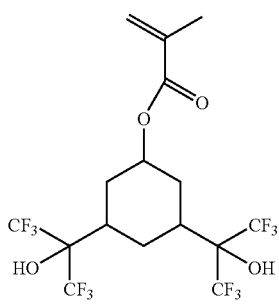

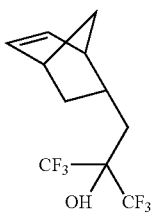

Suitable sulfonylamido monomers are as follows:

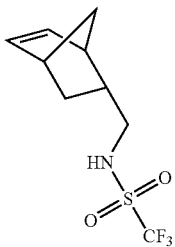
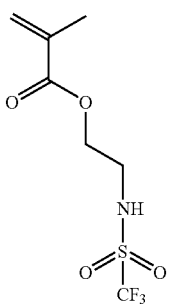

In another embodiment of the invention, the polymer of the present invention comprises a third monomer having a lactone substituent. Suitable third monomers have the following formula:

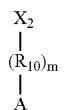

where $X_2$ is selected from $C_{3-4}$ alkylenylcarbonyloxy or $C_{5-20}$ cycloalkylenylcarbonyloxy or $C_{4-20}$ cycloalkylenyl each optionally substituted with one or more fluoro substituents; $R_{10}$ is $C_{1-6}$ alkyl or $C_{4-20}$ cycloalkyl each optionally substituted with one or more fluoro substituents; m is 0 or 1 and A is a $C_{4-20}$ lactone substituent. Examples of suitable lactone monomers are as follows:

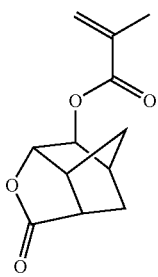
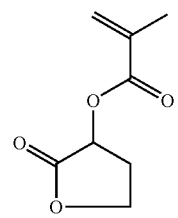

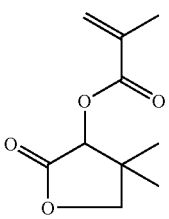
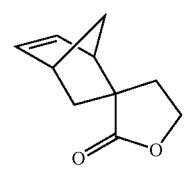

Suitable polymers for the composition of the present invention include the following:

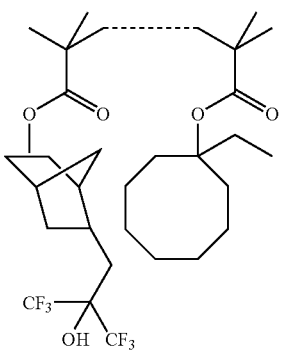

NBHFAMA-ECOMA

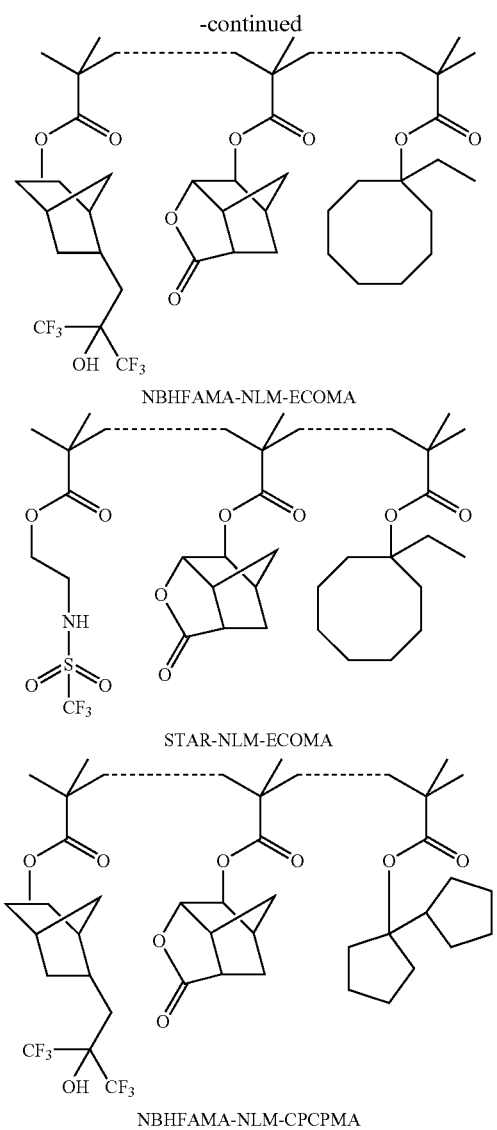

NBHFAMA-NLM-ECOMA

STAR-NLM-ECOMA

NBHFAMA-NLM-CPCPMA

In another embodiment of the invention, a photoresist composition comprises both the inventive polymer, as described in detail above, and a photoacid generator, with the polymer suitably representing up to about 99 wt. % of the solids included in the composition, and the photoacid generator representing approximately 0.1 to 25 wt. % of the solids contained in the composition.

The photoacid generator may be any compound that, upon exposure to radiation, generates a strong acid and is compatible with the other components of the photoresist composition. Examples of preferred photochemical acid generators (PAGs) include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605. Any PAG(s) incorporated into the present photoresists should have high thermal stability, i.e., be stable to at least 140° C., so they are not degraded during pre-exposure processing.

Any suitable photoacid generator can be used in the photoresist compositions of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane;

(4) trifluoromethanesulfonate esters of imides and hydroxyimides, e.g., α-(trifluoromethylsulfonyloxy)-bicyclo[2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and

(10) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al. (1991), Chemistry of Materials 3:395, and in U.S. Pat. No. 5,679,495 to Yamachika et al. Additional suitable acid generators useful in conjunction with the compositions and methods provided herein will be known to those skilled in the art and/or are described in the pertinent literature.

The remainder of the resist composition is generally composed of a solvent and may additionally, if necessary or desirable, include customary additives such as dyes, sensitizers, additives used as stabilizers, dissolution modifying additives, and acid-diffusion controlling agents, basic compounds, coating aids such as surfactants or anti-foaming agents, crosslinking agents, photospeed control agents, adhesion promoters and plasticizers.

The present invention also relates to a process for generating a resist image on a substrate comprising (a) coating a substrate with a film comprising the resist composition of the present invention; (b) imagewise exposing the film to radiation; (c) heating the film to a temperature of 75° C. or below; and (d) developing the image.

The first step involves coating the substrate with a film comprising the resist composition dissolved in a suitable solvent. Suitable substrates include, for example, silicon dioxide, silicon nitride and silicon oxynitride. Suitable solvents include cyclohexanone, ethyl acetate and propylene glycol methyl ether acetate. The film can be coated on the substrate using art known techniques such a spray or spin coating or doctor blading. Suitably, before the film is exposed to radiation, the film is heated to an elevated temperature of about 90 to 150° C. for a short period of time to remove excess solvent. The dried film has a thickness of about 0.2 to 5.0 microns.

The film is then imagewise exposed to an energy flux of radiation of x-ray, electron beam or ultraviolet. Suitable radiation is ultraviolet of 193 nm. Suitable radiation sources are ArF excimer or KrF excimer. Conveniently, due to the enhanced sensitivity of the resist film, a resist film of 1 micron thickness is fully exposed with less than about 50 mJ/cm$^2$, preferably less than about 30 mJ/cm$^2$ The radiation is absorbed by the resist composition and the radiation sensitive acid generator to generate free acid.

After exposure to radiation, the film is again heated to a low temperature of about 75° C. or less or at or below 75° C. for a short period time of about 1-2 minute(s) to cause cleavage of the acid cleavable ester substituent in the exposed portion of the resist composition with subsequent formation of the corresponding acid. Because this reaction can be processed at this lower temperature, there is substantially less diffusion of the photogenerated acid into unexposed areas of the film. This reaction proceeds at this low temperature due to the lower activation energy of the acid cleavable monomer in the inventive polymer. In another embodiment, the film is heated to a temperature of about 70° C. or less or at or below 70° C. In still another embodiment, the film is heated to a temperature of about 65° C. or less or at or below 65° C.

After heating, the resist image is developed in the film by art known techniques. Suitably, the film is exposed to a solvent, suitably an aqueous base such as tetramethyl ammonium hydroxide or choline. The solvent removes the portions of the film which were exposed to radiation to expose the underlying substrate. After the substrate has been exposed, circuit patterns can be formed on the substrate by coating the substrate with a conductive metal by art-known techniques.

Several methacrylate monomers containing 1-alkylcycloalkyl protecting groups were synthesized. They were co-polymerized with a fluoroalcohol containing methacrylate comonomer (NBHFMA 60 mol %) in identical compositions. Thermal deprotection temperatures of these copolymers were determined by thermo gravimetric analysis (TGA). The results are set forth in FIG. 1. Lower thermal deprotection temperature for the polymer can indicate lower activation energy (lower temperature) for the acid-catalyzed deprotection reaction.

Figure 6:
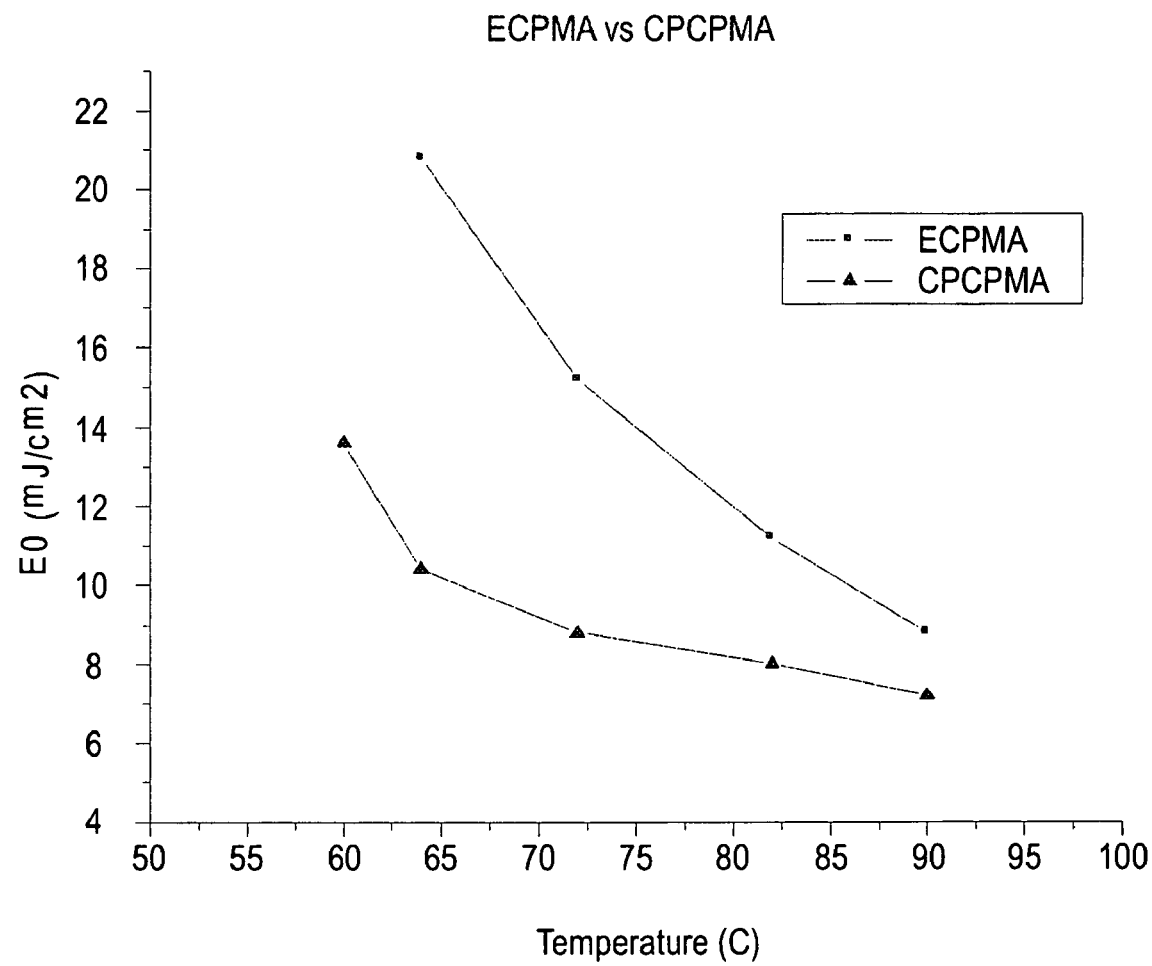
FIG. 6 is is a graph of temperature vs. $E_o$ values for the polymers of the present invention.

As seen from FIG. 6, bulky R$_2$ groups tend to reduce the activation energy for deprotection. For example, 1-cyclopentylcyclopentyl protecting group had a lower Ea than the 1-ethylcyclopentyl protecting group. We have also investigated several 1-cycloalkyl protecting groups ( i.e., alkylcycloalkyl) with substituents at the β-position. Even though the thermal stability of the protecting group was affected by the substituent at the β-position (R$_3$ and R$_4$ ), there appears to be minimal effect on the activation energy for acid-catalyzed deprotection. (e.g., 1-alkylcyclohexyl protecting groups with β-substituents (EMOCHXMA, BMOCHXMA) and without β-substituents (ECHXMA, BCHXMA). Placing methoxy groups in the β-position increases the thermal stability of the protecting group. However, in the resist formulations, the change in the activation energy for the deprotection reaction is minimal.

Figure 3:
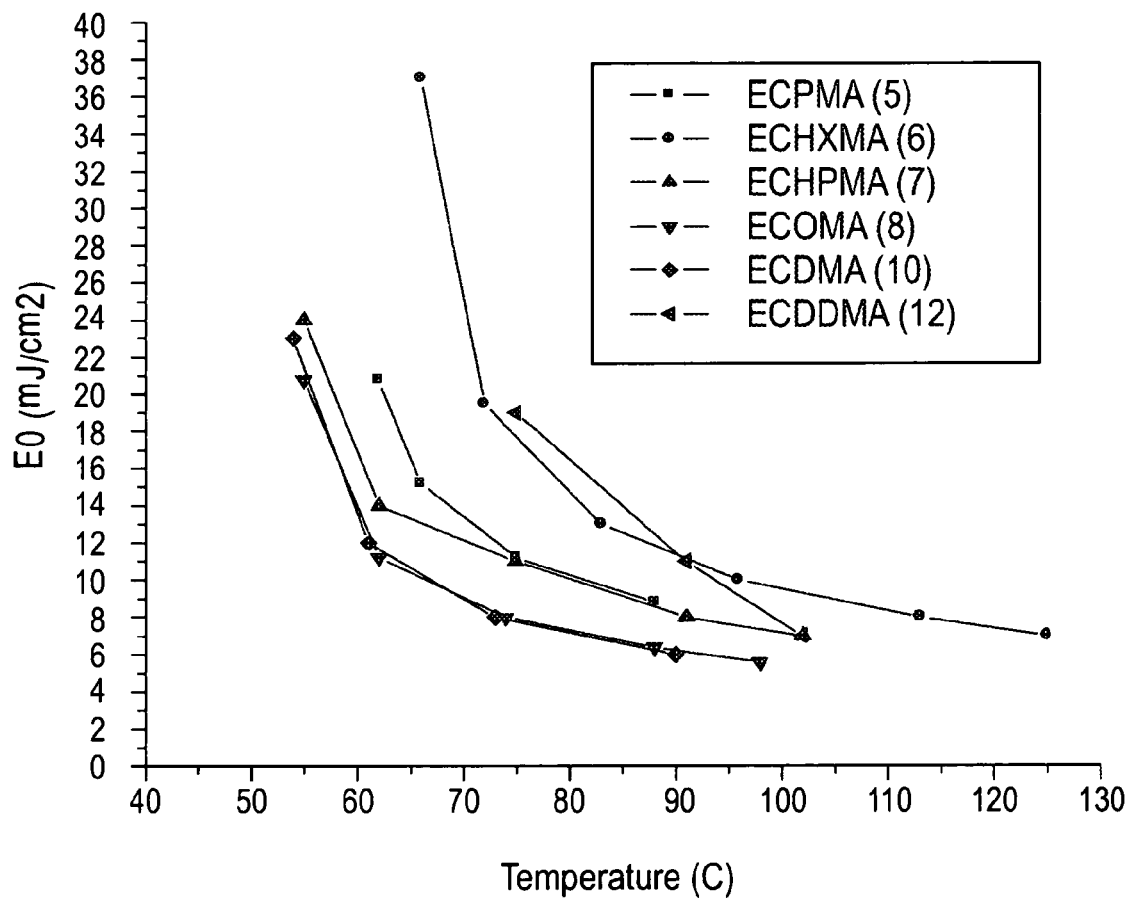
FIG. 3 is a graph of temperature vs. $E_o$ values of polymers of the present invention.
Figure 4:
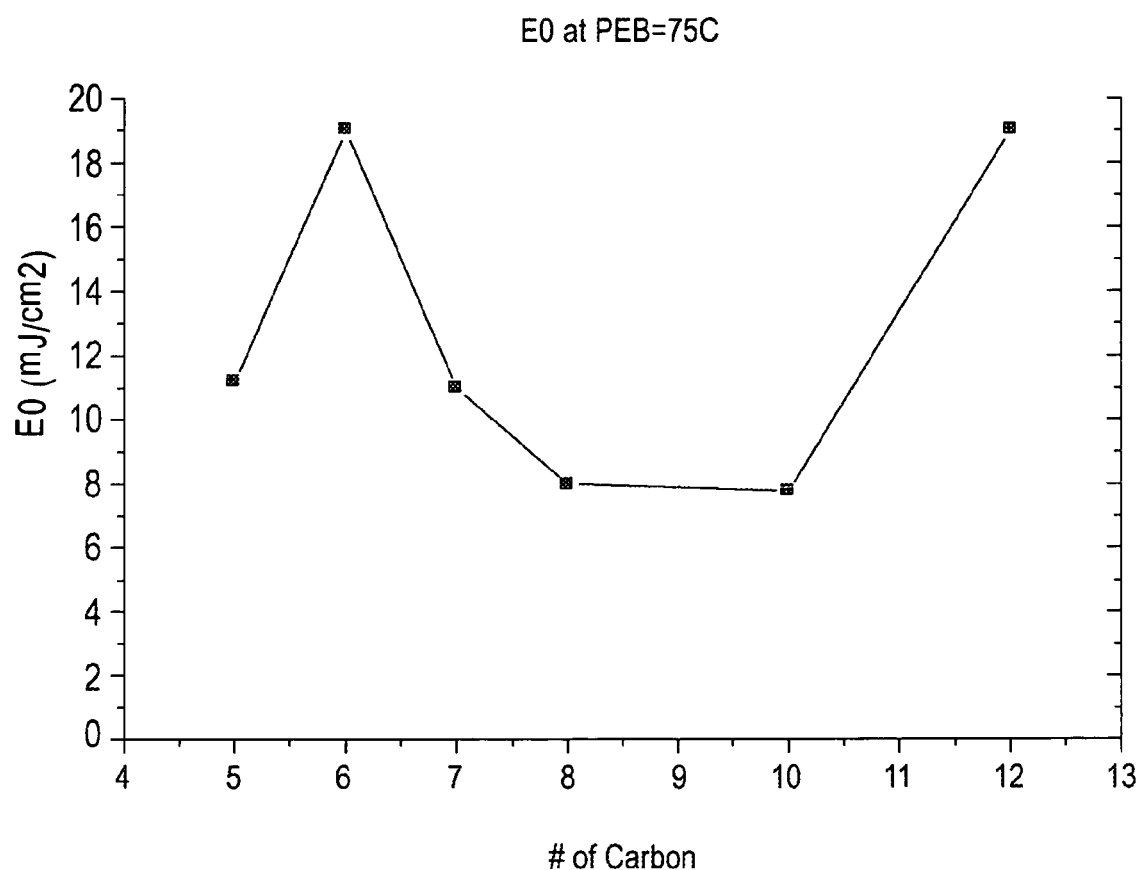
FIG. 4 is a graph showing $E_o$ values of polymers of the present invention.

In order to compare the activation energies of protecting groups, the polymers were then formulated into chemically amplified resists using identical amounts of the same photoacid generator (PAG) and other components. The films of the resists were then exposed to 193-nm radiation in increasing doses (open frames), post exposure baked (PEB) and developed in a 0.26 N TMAH developer. This experiment was performed at various PEB temperatures. Contrast curves (exposure dose vs. thickness remaining) at various temperatures were then plotted. The contrast curves at various temperatures for the ECOMA copolymer are presented in FIG. 2 as an example. Similar curves were created for other protecting groups. E$_0$ values (the lowest exposure dose required to completely dissolve the resist film in developer) at different temperatures were determined from these contrast curves. Then temperature vs. E$_0$ curves were plotted for each of the protecting groups in FIG. 3. The E$_o$ values of these copolymers at 75° C. (extracted from FIG. 3) are plotted in FIG. 4.

Figure 5:
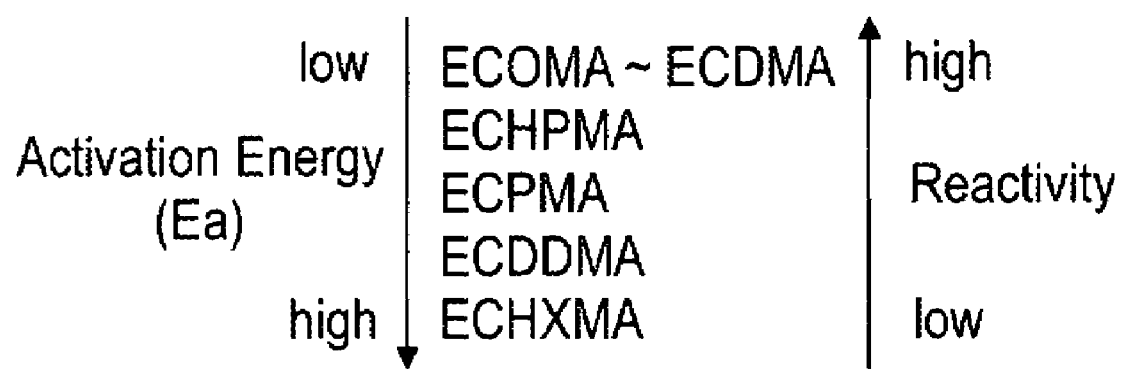
FIG. 5 is a visual presentation of the reactivity of the protecting groups in polymers of the present invention.

From this data, the order of the reactivities of these protecting groups was determined as set forth in FIG. 5. Lower E$_0$ corresponds to higher reactivity (or lower Ea). As mentioned previously, bulky R$_2$ groups also tend to reduce the activation energy of deprotection. We have compared the bulkier CPCPMA protecting group with the relatively smaller ECPMA protecting group. The following two polymers, NBHFAMA-ECPMA (60:40) and NBHFAMA-CPCPMA (60:40) were formulated into identical resist formulations and evaluated as described above. FIG. 6 shows the E$_0$ vs. temperature curves for these two protecting groups. The 1-cyclopentylcyclopentyl protecting group (CPCPMA) had a lower-Ea than the 1-ethylcyclopentyl protecting group (ECPMA).

EXAMPLES

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. Additionally, all starting materials were obtained commercially or were synthesized using known procedures. STAR and NLM monomers were obtained from the JSR Corporation.

Where appropriate, the following techniques and equipment were utilized in the Examples: $^1$H and $^{13}$C NMR spectra were run at room temperature on an Avance 400 spectrometer. Quantitative $^{13}$C NMR was run at room temperature in acetone-d$_6$ in an inverse-gated $^1$H-decoupled mode using Cr(acac)$_3$ as a relaxation agent on an Avance 400 spectrometer. For polymer composition analysis $^{19}$F NMR (379 MHz) spectra were also obtained using a Bruker Avance 400 spectrometer. Thermo-gravimetric analysis (TGA) was performed at a heating rate of 5° C./min in N$_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous tetramethylammonium hydroxide (TMAH) solution (CD-26). 193 nm dry exposures were carried out on an ISI mini-stepper with 0.60 NA. Wet exposures were carried out on a 193 nm interferometric tool assembled in-house. E-beam exposures were carried out on a Leica 100 kV exposure tool.

Example 1

Synthesis of 1-Ethyl-2-methoxycyclohexyl methacrylate (EMCHXMA)

Synthesis of 1-ethyl-2-methoxycyclohexanol

Ethylmagnesium bromide, 3.0 molar in diethyl ether (30 ml, 0.09 mole) was placed in a three neck flask equipped with a water condenser, addition funnel and a nitrogen inlet. The Grignard reagent was cooled in an ice/water bath and 2-methoxycyclohexanone (10 g, 0.078 mole) in 20 ml anhydrous diethyl ether was added dropwise. The contents were allowed to warm to room temperature and stirred for 3 hours. Afterwards, the mixture was quenched with 100 ml 3% hydrochloric acid solution. The organic phase was separated and the water phase was extracted with 50 ml ether. The ether solutions were combined and washed with 100 ml saturated sodium bicarbonate solution followed by 100 ml brine. The solution was dried over anhydrous magnesium sulfate and the solvent was removed in a rotary evaporator yielding 10.42 grams of crude alcohol. This was used without further purification.

Synthesis of 1-ethyl-2-methoxycyclohexyl methacrylate 1-ethyl-2-methoxycyclohexanol from the previous step (10 g, 0.063 mole) in 50 ml ether was placed in a three neck flask equipped with a water condenser, addition funnel and a nitrogen inlet. This solution was cooled in an ice/water bath and n-butyllithium, 1.6 molar in hexane (45 ml, 0.072 mole) was added dropwise. The contents were allowed to warm to room temperature and stirred for 30 minutes. The mixture was cooled again in ice/water bath and methacryloyl chloride (7.31 g, 0.070 mole) in 25 ml ether was added dropwise and heated to reflux for 30 minutes. The reaction mixture was cooled to room temperature and quenched with 125 ml of deionized water. The organic phase was separated and the water phase was extracted with 50 ml ether. The combined ether solutions were washed with 100 ml brine and dried over anhydrous magnesium sulfate. The solvent was removed in a rotary evaporator and the crude product was chromatographed on a neutral alumina column using hexane as elutant. The product was a clear liquid (9.79 g) which was characterized by NMR and IR.

Example 2

Synthesis of 1-Ethylcyclooctyl methacrylate (ECOMA)

a. Synthesis of 1-Ethylcyclooctanol

To a 1000-mL 3-necked round bottom flask equipped with a 500-mL pressure equalizing addition funnel, a nitrogen inlet with thermocouple and an overhead stirrer was added 100 g (0.79 mol) of cyclooctanone dissolved in 250 mL of dry tetrahydrofuran. The addition funnel was charged with 290 mL (0.869 mol, 10% excess) of ethyl magnesium bromide (2.0M solution in ether) which was then added to the cooled ketone over 2 hours. Stirring was continued at room temperature overnight followed by 8 hours at reflux. Excess Grignard reagent was discharged by the cautious addition of 100 mL of saturated sodium bicarbonate solution. The resulting suspension was filtered through a bed of Celite, the filtrate diluted with 500 mL of ether and the combined organics washed several times with saturated sodium bicarbonate, once with brine and then dried for 1 hr over anhydrous magnesium sulfate. Filtration and removal of the solvent at reduced pressure resulted in a light-colored oil which was distilled twice from $Na_2CO_3$ through a base-washed 15 cm Vigreux (bp 65° C.@1 mmHg) to yield 39 g (32%) of the title alcohol as a clear, colorless oil.

b. Synthesis of 1-Ethylcyclooctyl Methacrylate

To a 500-mL 3-necked round bottom flask equipped with a 250-mL pressure equalizing addition funnel, a nitrogen inlet with thermocouple and an overhead stirrer was added 32.5 g (0.208 mol) of 1-ethyl-1-cyclooctanol and 100 mL of anhydrous tetrahydrofuran. The addition funnel was charged with 150 mL (0.239 mol, 15% excess) of n-butyllithium (1.6M in hexane) which was then added to the cooled alcohol over 2 hours. The addition funnel was then charged with a solution of 25 g (0.239 mol) of freshly distilled methacryloyl chloride in 50 mL of dry tetrahydrofuran which was then added slowly with cooling over 1.5 hours. The reaction mixture was allowed to warm to room temperature with stirring overnight after which 100 mL of saturated sodium bicarbonate was carefully added with stirring. The mixture was stirred for 1 hour at which time it was diluted with 500 mL of diethyl ether and the organics washed with water, brine and dried for 1 hour over anhydrous magnesium sulfate. Filtration and removal of the solvent at reduced pressure resulted in a light-colored oil which was distilled twice from $Na_2CO_3$ and phenothiazine through a based-washed 15-cm Vigreux to yield 24 g (51%) of the title compound (bp 84° C. @ 1 mmHg) as a clear, colorless oil.

Example 3

Synthesis of 1-Cyclopentlcyclopentyl methacrylate (CPCPMA)

a. Synthesis of 1-Cyclopentylcyclopentanol

To a 1000-mL 3-necked round bottom flask equipped with a 250-mL pressure equalizing addition funnel, a nitrogen inlet with thermocouple and an overhead stirrer was added 172 mL (1.72 mol) of a 10M solution of $BH_3$—$Me_2S$ in tetrahydrofuran and 300 mL of dry tetrahydrofuran. The addition funnel was charged with 116.8 g (1.72 mol) of cyclopentadiene dissolved in 100 mL of dry tetrahydrofuran. The flask was immersed in an ice-water bath and the cyclopentadiene solution slowly added over 2 hours at 0-5° C. Stirring was continued for an additional 90 min at this temperature at which time 130 mL of methanol was cautiously added over 1 hour with vigorous evolution of hydrogen. The solvent was then removed under reduced pressure and the remaining oil transferred to a 5 L 3-necked round bottom flask equipped with a thermocouple inlet, overhead stirrer and a 500-mL addition funnel. Dichloromethane (2 L) and water (500 mL) were added and the mixture cooled to 5° C. The addition funnel was charged with 100 mL (1.95 mol) of bromine which was then added slowly over 1 hr. The resulting dark mixture was exposed to a long wave UV lamp with stirring at room temperature overnight by which time the bromine color had largely disappeared. The reaction mixture was recooled to 5° C. and 1.3 L of 6N NaOH was added slowly via the addition funnel followed by 400 mL of 30% hydrogen peroxide. After stirring overnight at room temperature the organic layer was separated, washed several times with water, once with brine and then dried over anhydrous magnesium sulfate for 1 hour. Filtration and removal of the solvent at reduced pressure resulted in a light-colored oil which was distilled from $Na_2CO_3$ through a short Vigreux (bp 63° C. @ 1 mmHg) to yield 72 g (55%) the title alcohol as a clear, colorless oil.

b. Synthesis of 1-Cyclopentylcyclopentyl methacrylate

To a 1-L 3-necked round bottom flask equipped with a 250-mL pressure equalizing addition funnel, a nitrogen inlet with thermocouple and an overhead stirrer was added 56 g (0.364 mol) of 1-cyclopentyl-1-cyclopentanol and 400 mL of anhydrous tetrahydrofuran. The addition funnel was charged with 250 mL (0.4 mol) of n-butyllithium (1.6M in hexane) which was then added to the cooled alcohol over 2 hours. The addition funnel was then charged with a solution of 41 g (0.39 mol) of freshly distilled methacryloyl chloride in 100 mL of dry tetrahydrofuran which was then added slowly with cooling over 1.5 hours. The reaction mixture was allowed to warm to room temperature with stirring overnight after which 100 mL of saturated sodium bicarbonate was carefully added with stirring. The mixture was stirred for 1 hour at which time it was diluted with 1 L of diethyl ether and the organics washed with water, brine and dried for 1 hour over anhydrous magnesium sulfate. Filtration and removal of the solvent at reduced pressure resulted in a light-colored oil which was eluted with hexane through a column of 600 g of silica gel. The UV active fractions were collected and the solvent removed at reduced pressure to yield 74 g (91%) of the title compound as a clear, colorless oil.

Example 4

Synthesis of Copolymer (NBHFAMA-ECOMA 60/40)

NBHFAMA (8.10 g, 0.0225 mole), 1-ethylcyclooctyl methacrylate (ECOMA) (3.50 g, 0.015 mole) and 35 grams of tetrahydrofuran were placed in a round bottom flask equipped with a condenser and a nitrogen inlet. 2,2'-Azobisisobutyronitrile (AIBN) (0.246 g, 0.0015 mole) and 1-dodecanethiol (0.227 g, 0.0011 mole) were added to this solution and stirred until dissolved. Then, the solution was degassed using four vacuum/nitrogen purges. The contents were then heated to reflux for 18 hours. Afterwards, the solution was added dropwise into hexanes (1 liter). The precipitated polymer was filtered (frit), washed twice with hexanes (100 ml) and dried under vacuum at 60° C. Yield: 4.4 grams. Mw=10,727, Polydispersity=1.23

Example 5

Synthesis of Terpolymer (NBHFAMA-NLM-CPCPMA 15/40/45)

NBHFAMA (1.08 g, 0.003 mole), NLM (1.78 g, 0.008 mole), 1-cyclopentylcyclopentyl methacrylate (CPCPMA) (2.00 g, 0.009 mole) and 15 grams of tetrahydrofuran were placed in a round bottom flask equipped with a condenser and a nitrogen inlet. 2,2'-Azobisisobutyronitrile (AIBN), (0.131 g, 0.008 mole) and 1-dodecanethiol (0.121 g, 0.009 mole) were added to this solution and stirred until dissolved. Then, the solution was degassed using four vacuum/nitrogen purges. The contents were then heated to reflux for 18 hours. Afterwards, the solution was added drop wise into hexanes (400 ml). The precipitated polymer was filtered (frit), washed twice with hexanes (50 ml) and dried under vacuum at 60° C. Yield: 3.94 grams. Mw=7,497, Polydispersity=1.46

Example 6

Synthesis of Terpolymer (STAR-NLM-ECOMA 15/40/45)

STAR (0.78 g, 0.003 mole), NLM (1.78 g, 0.008 mole), 1-ethylcyclooctyl methacrylate (ECOMA) (2.01 g, 0.009 mole) and 14 grams of tetrahydrofuran were placed in a round bottom flask equipped with a condenser and a nitrogen inlet. 2,2'-Azobisisobutyronitrile (AIBN) (0.131 g, 0.0008 mole) and 1-dodecanethiol (0.121 g, 0.0011 mole) were added to this solution and stirred until dissolved. Then, the solution was degassed using four vacuum/nitrogen purges. The contents were then heated to reflux for 18 hours. Afterwards, the solution was added drop wise into hexanes (400 ml). The precipitated polymer was filtered (frit), washed twice with hexanes (100 ml) and dried under vacuum at 60° C. Yield: 3.8 grams. Mw=6,221, Polydispersity=1.56

Example 7

Resist Formulation based on NBHFAMA-ECOMA (60/40)

Copolymer (NBHFAMA-ECOMA) (1.0 grams), and a sulfonium Photo Acid Generator (PAG) (50 mg) and a base additive were dissolved in propylene glycol monomethyl ether acetate (PGMEA, 7 grams). The solution was filtered through a 0.2 µm filter.

Example 8

Resist Evaluation

Figure 7:
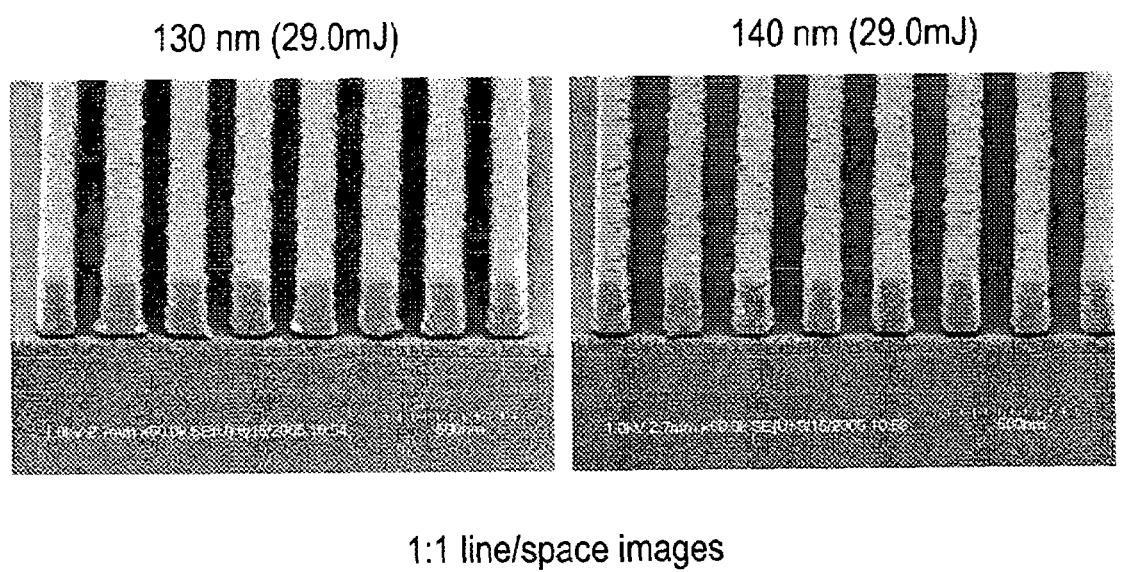
FIGS. 7-9 are photographs of resist images of compositions of the present invention.

A silicon substrate was coated with 2000 Å of a positive resist composition (Example 7 above). The film was baked at 120° C. for 1 minute to drive off the solvent. The film was then imagewise exposed at 193 nm (dose 15-100 mJ/cm2) on an ISI-Mini Stepper, 0.60 NA. It was then baked at 60° C. for 1 minute and developed with 0.263 N tetramethyl ammonium hydroxide. High resolution images (FIG. 7) were obtained with this resist.

Example 9

Exposure Under Immersion Conditions

Figure 8:
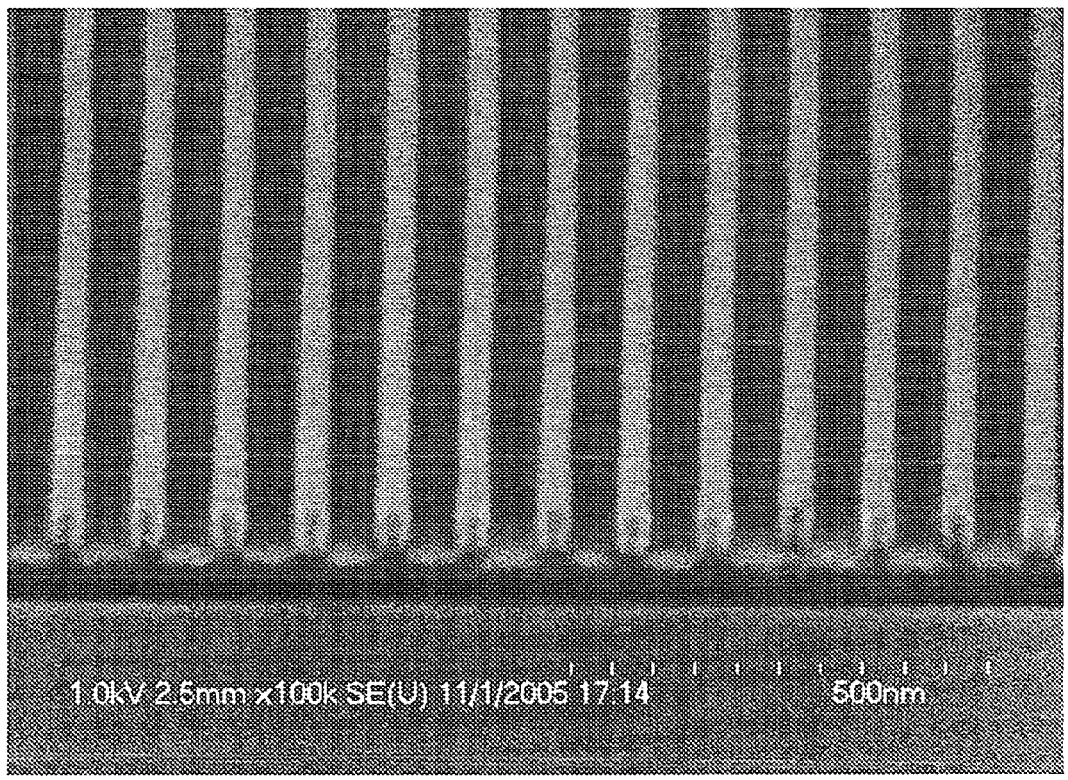

A silicon substrate was coated with 500 Å of a positive resist composition (Example 7 above). The film was baked at 120° C. for 1 minute to drive off the solvent. A topcoat, TSP-3A from Tokyo-Ohka Company, was coated over this film and baked at 90° C. for 1 minute. The film stack was then image wise exposed in a 193 nm interferometric tool under water (dose 15-100 mJ/cm2). It was then baked at 60° C. for 1 minute. The topcoat was removed with a proprietary topcoat remover provided by Tokyo-Ohka Company and then developed with 0.263 N tetramethyl ammonium hydroxide. High resolution images (FIG. 8) were obtained with this resist.

Example 10

E-beam Exposures

Figure 9:
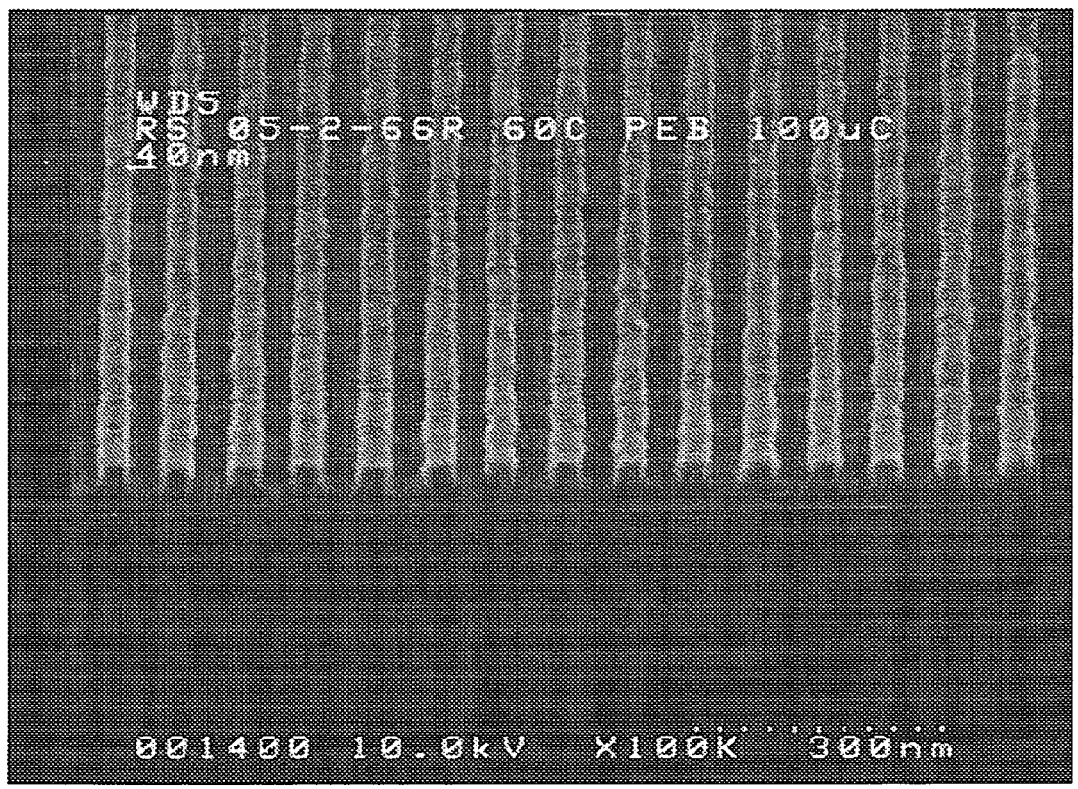

A silicon substrate was coated with 460 Å of a positive resist composition (Example 7 above). The film was baked at 120° C. for 1 minute to drive off the solvent. The film was then imaged on a 100 kV E-beam tool. It was then baked at 60° C.

for 1 minute and developed with 0.263 N tetramethyl ammonium hydroxide. High resolution images (FIG. 9) were obtained with this resist.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Although this invention has been described with respect to specific embodiments, the details thereof are not to be construed as limitations for it will be apparent that various embodiments, changes and modifications may be resorted to without departing from the spirit and scope thereof and it is understood that such equivalent embodiments are intended to be included within the scope of this invention.

The invention claimed is:

1. A process for generating a photoresist image on a substrate comprising:
   (a) coating the substrate with a photoresist film comprising a polymer consisting essentially of three monomers having the structures:

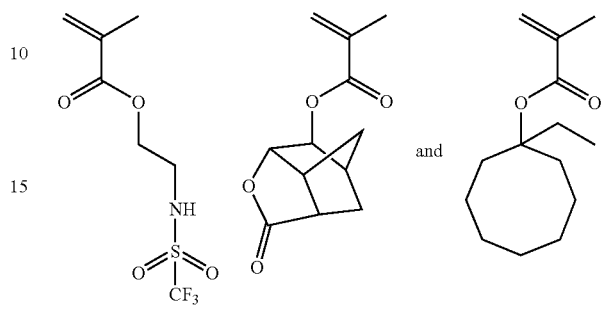

(b) imagewise exposing the film to 193 nm radiation;
   (c) heating the film to a temperature at or below about 65 C.; and
   (d) developing the image to the substrate.

* * * * *